US011853126B1

(12) United States Patent
Buton et al.

(10) Patent No.: US 11,853,126 B1
(45) Date of Patent: Dec. 26, 2023

(54) SYSTEM FOR CONFIGURING A WEB INTERFACE SERVER

(71) Applicant: Nationwide Mutual Insurance Company, Columbus, OH (US)

(72) Inventors: Joseph Buton, Westerville, OH (US); Brian S. Smith, Sunbury, OH (US)

(73) Assignee: Nationwide Mutual Insurance Company, Columbus, OH (US)

( * ) Notice: Subject to any disclaimer, the term of this patent is extended or adjusted under 35 U.S.C. 154(b) by 313 days.

(21) Appl. No.: 17/396,435

(22) Filed: Aug. 6, 2021

Related U.S. Application Data

(60) Provisional application No. 63/062,091, filed on Aug. 6, 2020.

(51) Int. Cl.
| | |
|---|---|
| *G06F 1/16* | (2006.01) |
| *G06F 1/20* | (2006.01) |
| *H05K 7/14* | (2006.01) |
| *H05K 7/20* | (2006.01) |
| *G06F 1/3296* | (2019.01) |

(52) U.S. Cl.
CPC ............ *G06F 1/1656* (2013.01); *G06F 1/203* (2013.01); *G06F 1/3296* (2013.01); *H05K 7/1488* (2013.01); *H05K 7/20736* (2013.01)

(58) Field of Classification Search
CPC ....... G06F 1/1656; G06F 1/203; G06F 1/3296
See application file for complete search history.

(56) References Cited

U.S. PATENT DOCUMENTS

| | | | |
|---|---|---|---|
| 2013/0250507 A1* | 9/2013 | Ito ........................ | H05K 7/1445 |
| | | | 361/679.32 |
| 2017/0228339 A1* | 8/2017 | Shao ................... | G06F 13/4282 |

* cited by examiner

*Primary Examiner* — Adolf D Berhane
*Assistant Examiner* — Afework S Demisse
(74) *Attorney, Agent, or Firm* — Thomas E. Lees, LLC

(57) ABSTRACT

A system for configuring a server including a portable housing having a front panel, a back panel, and a cutout disposed on the front panel, a control board disposed within the portable housing, the control board having a socket configured to operably receive and couple to a network interface card that is insertable into and removable from the housing only through the cutout, and a rib disposed within the portable housing between the front panel and the back panel, the rib having a support configured and dimensioned to engage the network interface card when the network interface card is inserted within the housing in an aligned configuration with the socket, a cooling system coupled to and powered via the control board, the cooling system including one or more fans disposed at least partially disposed within the portable housing, and a power supply system coupled to the control board.

14 Claims, 12 Drawing Sheets

SYSTEM FOR CONFIGURING A WEB INTERFACE SERVER

CROSS-REFERENCE OF RELATED APPLICATIONS

This application claims the benefit of U.S. Provisional Patent Application No. 63/062,091 filed Aug. 6, 2020 entitled "System for Configuring a Web Interface Server", which is incorporated by reference herein in its entirety.

FIELD OF THE INVENTION

The invention relates to a system for configuring a web interface server, and more particularly, a portable system for configuring network interface cards associated with a web interface server.

SUMMARY OF THE INVENTION

One embodiment of the present invention is directed to a system for configuring a server including a portable housing having a front panel, a back panel opposite the front panel, and a cutout disposed on the front panel, a control board disposed within the portable housing, the control board having a socket configured to operably receive and couple to a network interface card that is insertable into and removable from the housing only through the cutout, wherein the socket aligns with a feature of the network interface card that engages the socket to power the network interface card and the control board is configured to communicate with the network interface card, a rib disposed within the portable housing between the front panel and the back panel, the rib having a support configured and dimensioned to engage the network interface card when the network interface card is inserted within the housing in an aligned configuration with the socket, a cooling system coupled to and powered via the control board, the cooling system including one or more fans disposed at least partially disposed within the portable housing, and a power supply system coupled to the control board, the power supply system configured to provide power to the control board, the network interface card, and the one or more fans.

In some embodiments, the one or more fans are disposed on the back panel.

In some embodiments, the portable housing has a length 11 inches or less and a width 6.75 inches or less. The system may include one or more ventilation holes disposed on the portable housing. The one or more ventilation holes may be disposed on atop surface and/or a bottom surface of the portable housing.

In some embodiments, the cutout is sized and dimensioned to permit at least a portion of the network interface card to engage the front panel when the network interface card is inserted within the cutout of the housing in operable engagement with the control board and supported by the rib.

In some embodiments, the system includes a plurality of sockets and a plurality of cutouts configured to simultaneously operably receive a plurality of network interface cards that when inserted into the plurality of cutouts are in parallel alignment.

In some embodiments, the system includes a mount disposed within the housing and substantially perpendicular to the rib, the mount configured to abut the network interface card when the network interface card is inserted through the cutout.

In some embodiments, the system includes one or more switches coupled to the control board.

In some embodiments, a power regulator configured to step down power supplied from the power supply system.

Another embodiment of the present invention provides a method for configuring a server, the method includes placing a network interface card into an cutout of a portable server configuration system, the portable server configuration system including a housing and a control board disposed within the housing, securing the network interface card into a socket disposed on the control board, the socket configured to secure and lock the network interface card in place, coupling the network interface card to the control board such that power is transmitted to the network interface card from the control board, coupling an electronic device to the network interface card to configure the network interface card, removing the configured network interface card from the portable server configuration system, and placing the configured network interface card in a power supply unit such that the power supply unit is coupled to the network interface card, wherein the power supply unit is located remote to the portable server configuration system. In some embodiments, the electronic device is one of a computer, a laptop, or a mobile device.

In some embodiment, the electronic device is one of a computer, a laptop, or a mobile device.

The method of includes removing an outdated network interface card from a power supply.

In some embodiments, the power supply unit is an uninterruptible power supply.

BACKGROUND OF THE INVENTION

Current systems for updating and configuring servers require the use of network interface cards and an uninterruptible power supply (UPS) to ensure that the server is powered and continues to maintain normal operation. Further, traditional methods of updating and configuring a server, such as a web server, require a user to remain on-site at the location of the UPS and server. Current UPS systems are heavy, burdensome, power consuming, and take up large amounts of space. In addition, current UPS systems are not portable requiring users to stay proximate the UPS to update and configure network interface cards associated with servers coupled to the UPS.

BRIEF DESCRIPTION OF THE SEVERAL VIEWS OF THE DRAWINGS

The foregoing summary, as well as the following detailed description of embodiments of the system for configuring a web interface server, will be better understood when read in conjunction with the appended drawings of an exemplary embodiment. It should be understood, however, that the invention is not limited to the precise arrangements and instrumentalities shown.

DETAILED DESCRIPTION OF THE INVENTION

Exemplary embodiments of the present invention provide a system for configuring a web interface server. An embodiment of the present invention provides an exemplary system as shown in FIGS. 1-12. In use, system 100 may be used for configuring a network interface card or controller associated with a server, such as a web interface server. For example, system 100 may be a lightweight, portable device configured to receive a network interface card to allow a user to configure the network interface card from any location. System 100 is configured and dimensioned to permit a user to securely configure a server associated with and/or coupled to an uninterruptible power supply (UPS) at a remote location. In some embodiments, system 100 is configured and dimensioned to permit a user to pre-configure network interface card 103 to be used at servers, such as web management interface servers, thereby reducing the time required to updated and/or configure a server. For example, system 100 is configured and dimensioned to permit a user to pre-configure a network interface card that is coupled with system 100. This allows the user to send the pre-configured network interface cards on-site to the location of the servers, which is external to the production environment.

Figure 1:
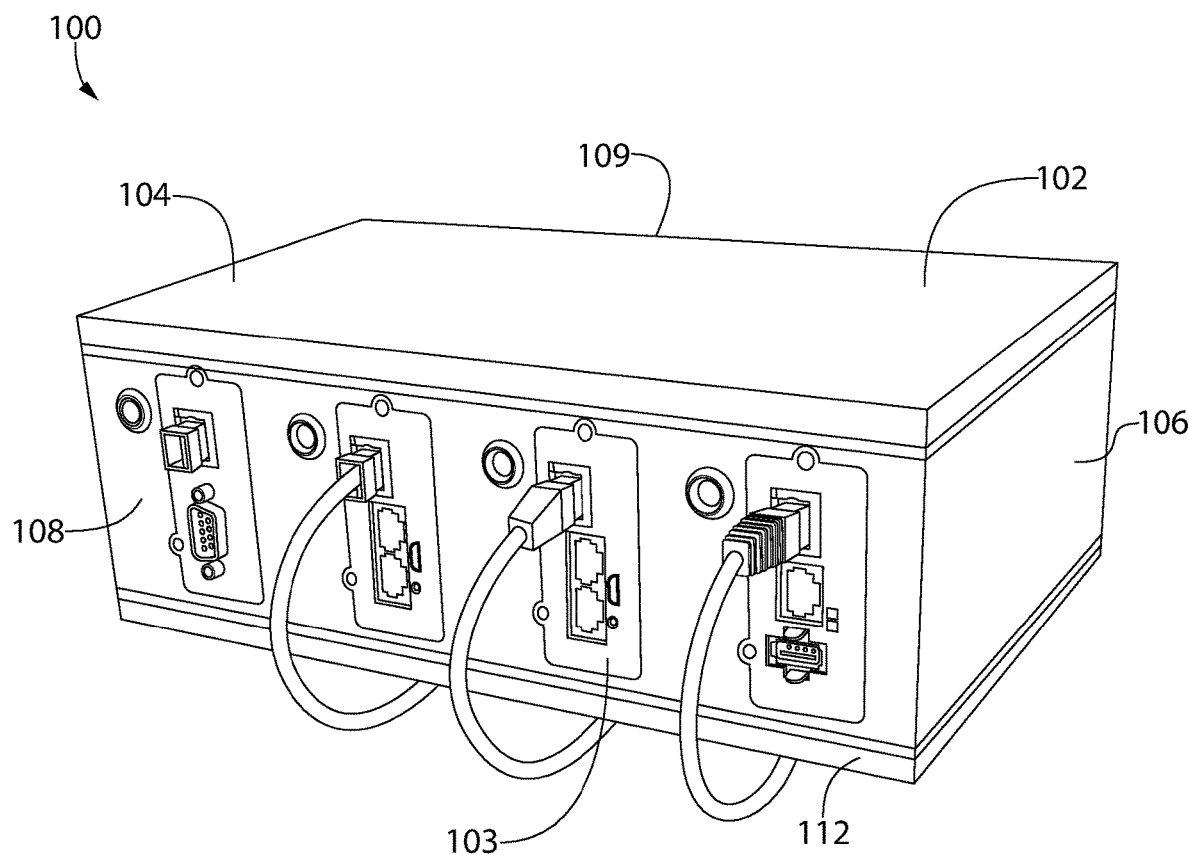
FIG. 1 is a top perspective view of a system for configuring a web interface server in accordance with an exemplary embodiment of the present invention.
Figure 2A:
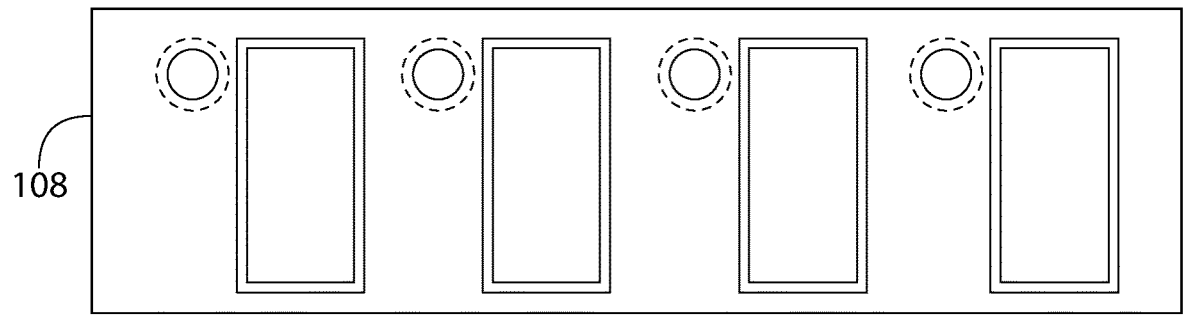
FIG. 2A is a schematic diagram of a front panel of the system of FIG. 1 in accordance with an exemplary embodiment of the present invention.
Figure 2B:
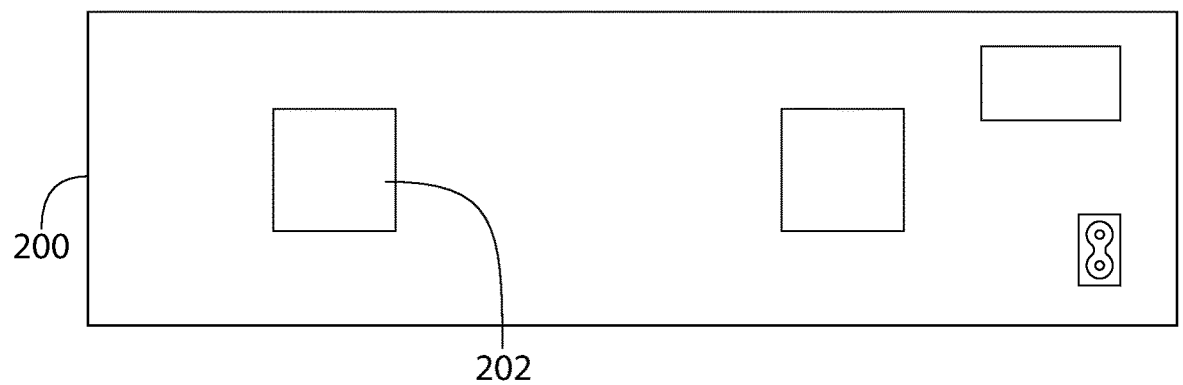
FIG. 2B is a schematic diagram of a back panel of the system of FIG. 1 in accordance with an exemplary embodiment of the present invention.
Figure 3:
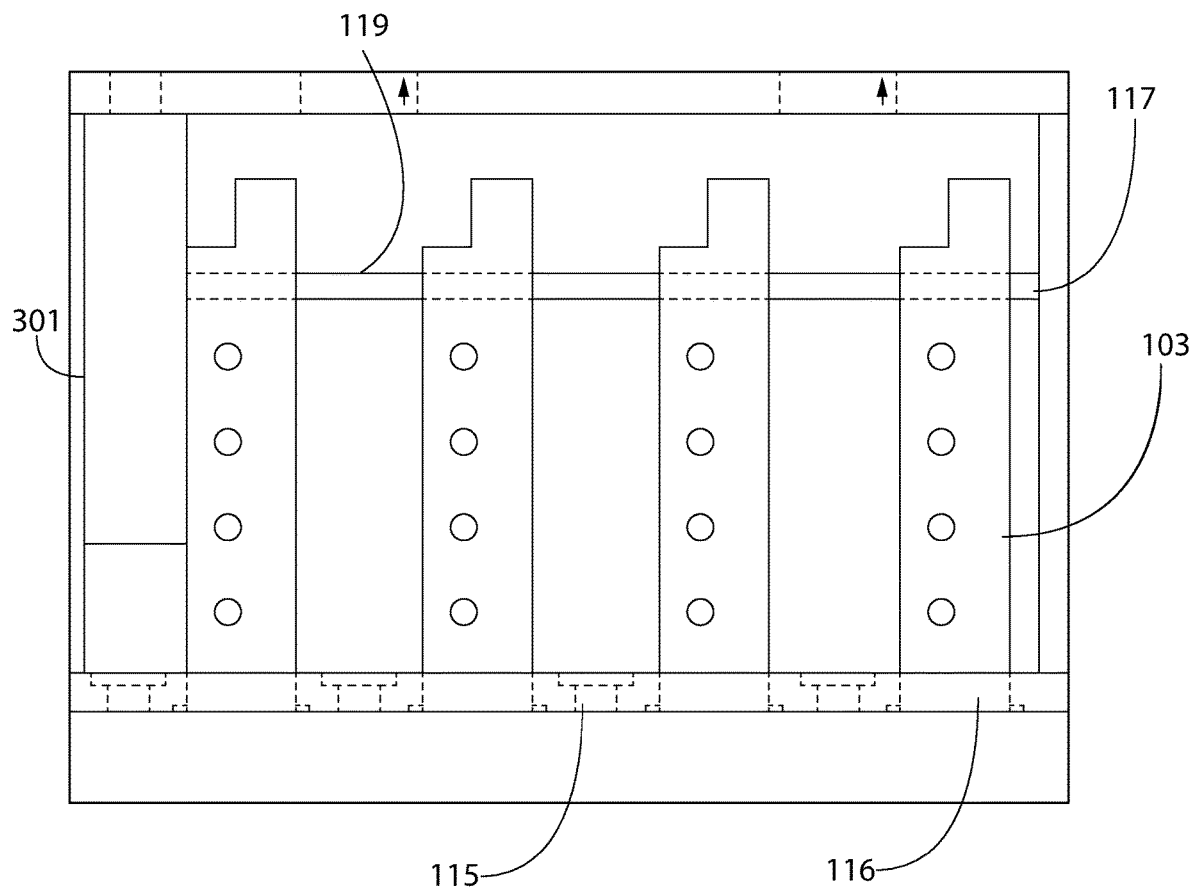
FIG. 3 is a top cross-sectional schematic diagram of the system of FIG. 1 in accordance with an exemplary embodiment of the present invention.

Referring to FIGS. 1-3, system 100 may include a small portable housing 102 having cutouts that receive network interface card 103. System 100 may include sockets/bays disposed on a control board that are configured to receive a portion of network interface card 103 to provide power to network interface card 103. Housing 102 of system 100 may include one or more ribs 117 that assist in guiding network interface card 103 into socket 116 when network interface card 103 is inserted through cutout 110. Rib 117 may abut network interface card 103 when network interface card 103 is at least partially disposed within housing 102. In one embodiment, network interface card 103 is configured to be used within a UPS for health monitoring and state reporting. System 100 may have one, two, three, four, or greater than four sockets for receiving a plurality of network interface cards 103. System 100 may be configured to be plugged into a standard wall socket or power source. In some embodiments, system 100 does not include any additional batteries or capacitors, such as those contained within a conventional UPS. In an alternative embodiment, system 100 includes a battery or capacitor to allow for system 100 to be powered when not plugged into a power source. In some embodiments, system 100 is configured to only permit the battery or capacitor to provide power to system 100 when system 100 is not connected to a direct power source. The battery may include an internal non-removable rechargeable battery, an internal removable rechargeable battery, an external rechargeable battery, and/or an external non-rechargeable battery. System 100 may include a cooling system configured to cool network interface card 103. During use, a network interface card may be inserted into system 100, which is connected to a network and/or directly to a computer. For example, system 100 may be connected to a computer, which is coupled to a computer network.

In practice, a user may update network interface card 103 configuration with the necessary information and protocols for using system 100. For example, a user may place a network interface card within system 100 and update the necessary information and protocols. A user may then remove the updated network interface card from system 100, remove the outdated network interface card from the UPS, and place the updated network interface card within the UPS associated with the server to be updated, where the updated network interface card will be used. In practice, the outdated network interface card, which was in the UPS, is removed and replaced with the updated network interface card. In some embodiments, the removal of the outdated network interface card and replacing it with the updated network interface card takes less than 3 minutes (e.g., approximately 2 minutes) for the network interface card to boot up, compared to approximately 40 minutes required for traditional systems and methodologies. However, the removal and replacing process may take less than 5 minutes, less than 10 minutes, less than 15 minutes, less than 30 minutes, less than 40 minutes, or less than 60 minutes. In some embodiments, the UPS associated with the server is never offline during the boot time (e.g., approximately 2 minutes boot time) to ensure that power is never interrupted to the servers. Compared to traditional methodologies and systems, which required the on-site technician to take the old network interface card out of the UPS monitoring, replace the old network interface card with a new network interface card and updated/configure the network interface card, all on-site, system 100 allows a user to update and/or configure the new network interface card at any location.

Further, the traditional methodologies and systems required the server to be offline when connecting to and configuring a new network interface card. These traditional methodologies took 40 minutes or greater and required the UPS monitoring services to be offline due to users having to manually configure network interface card 103 on-site. The server must be offline while the user is manually configuring network interface card 103 on site. System 100 allows a user to pre-configure network interface card 103 prior to network interface card 103 arriving on-site. This results in the server only being offline for a shorter amount of time (e.g., 3-10 minutes) while the outdated network interface card is replaced with the updated network interface card in the UPS. System 100 allows a user a more robust code development and testing platform whereby security changes and firmware deployment tested pre-deployment can be developed and deployed with ease. For example, system 100 allows for a user to verify and test code outside of production systems thereby reducing the risk associated with live system outages. In some embodiments, system 100 allows a user to alter and revise code without affecting large systems. For example, system 100 allows a user to revise and test code on a single system without having it affect multiple systems. Once the code on network interface card 103 used within system 100 has been verified by the user, network interface card 103 may then be used with multiple systems.

In some embodiments, system 100 allows a network interface card to be configured and updated outside production, which reduces the duration that the UPS services are offline. System 100 may also allow a user to verify code received from a third party, such as a vendor. For example, prior to implementing a network interface card throughout an entire system, a user may use system 100 to verify that the code is compatible with user's entire system via a testing protocol. System 100 may act like an isolated system prior to implementing the code on an entire system. In some embodiments, system 100 includes a plurality of network interface cards 103 to simulate a larger system. This configuration allows a user to test code on a larger isolated system without impacting the live network.

In some embodiments, system 100 allowing for pre-configuration of network interface card 103 reduces the time required to update a network interface card. For example, system 100 allows a user to test and verify that an updated code works within network interface card 103, which is not coupled to the entire network. Once it is confirmed that the code works with network interface card 103, it may be implemented into the entire network without concern for errors and crashing of the entire network. Traditional systems and methodologies require users to review and update the code on the entire network while the entire network is offline. While the entire network is offline, the user has to tediously review the entire code to ensure there are no errors as an error may result in the entire network crashing. System 100 provides an isolated environment to test and verify the code without concern for crashing a network and causing loss to a business. Using system 100, a user may confirm that the code works in the isolated system, which indicates that itis safe to work on the entire network.

In some embodiments, system 100 is used to assist users providing customer service to customers. For example, system 100 may allow a representative to simulate issues within an isolated system without altering the code of an entire system. In practice, system 100 allows a representative to simulate and troubleshoot issues without concern for impacting the overall system and network. In some embodiments, system 100 is configured to house a plurality of network interface cards 103 and user may log into each of the plurality of network interface card 103 to test a specific configuration or protocol on each card.

Referring to FIG. 1, system 100 may include housing 102. Housing 102 may include top surface 104, bottom surface 112, side walls 106, front panel 108, back panel 109, and cutouts or openings 110. In some embodiments, housing 102 is a cuboidal in shape. However, housing 102 may be a hexagonal prism, a pentagonal prism, a rectangular prism or cylindrical. Housing 102 may be sized and shaped to allow system 100 to be portable. In some embodiments, housing 102 is approximately 11 inches in length, 7 inches in width, and 5 inches in height. However, housing 102 may have any other dimensions desired to allow system 100 to be portable. In one embodiment, housing 102 is comprised of wood. However, housing 102 may be comprised of one or more of metal, plastic, wood, ceramic, glass, composite, or any other material desired to allow housing 102 to be portable. In some embodiments, housing 102 is comprised of a material capable of assisting in heat dissipation.

Housing 102 may a length of approximately 11 inches, a depth of approximately 6.75 inches, and a height of approximately 4.5 inches. However, housing 102 may have a length of 5 inches to 15 inches, a depth of 3 inches to 10 inches, and a height of 1 inches to 8 inches. In some embodiments, housing 102 has a weight under 5 lbs. For example, housing 102 may have a weight of approximately 3.4 lbs. However, housing 102 may have a weight of 1 lbs to 10 lbs. In some embodiments, housing 102 has a length of approximately 5.5 inches, a depth of approximately 6 inches, a height of approximately 1.75 inches, and a weight of 1.25 lbs.

Figure 6:
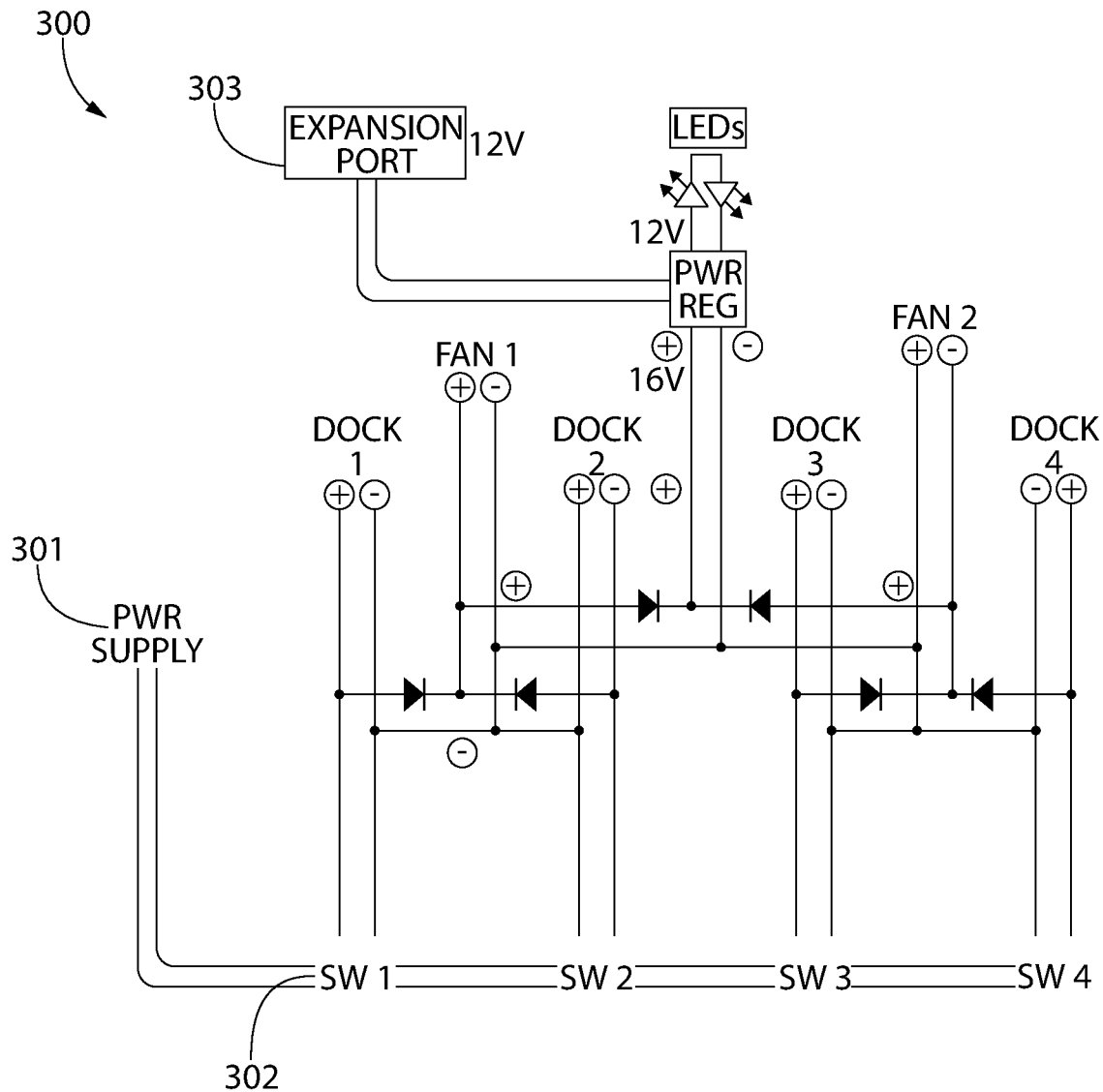
FIG. 6 is a wiring schematic diagram of the system of FIG. 1 in accordance with an exemplary embodiment of the present invention.

Referring to FIGS. 1 and 6, housing 102 may include control board 300. Control board 300 may be disposed within housing 102 and may be configured to receive one or more network interface cards 103. For example, control board 300 may include one or more sockets 116, which may be configured to allow control board 300 to couple to the network interface card 103. For example, sockets 116 may be disposed on control board 300 and may be configured to receive and secure a network interface card, such as those manufactured by Vertiv or Eaton. In some embodiments, control board 300 is disposed on or adjacent to back panel 109. However, control board 300 may be disposed on or adjacent to bottom surface 112.

In some embodiments, sockets 116 of control board 300 may be configured to allow control board 300 to couple to and communicate with network interface card 103 103, such as IntelliSlot cards. Network interface card 103 may be configured to deliver web management services (e.g., server updates) to UPS or other systems. For example, network interface card 103 may be used with a Simple Network Management Protocol (SNMP) for collecting and organizing information regarding devices on a network and for modifying that information. In practice, a user may insert network interface card 103 into housing 102 via cutout 110 and network interface card 103 may be secured to socket 116 of control board 300.

In some embodiments, sockets 116 of control board 300 may be compatible with or configured to operate with other types of network interface cards 103 or computer cards. For example, one or more of sockets 116 may be configured to work with IntelliSlot cards, PCIe cards, network cards, Ethernet cards, communication cards, or any other type of computer associated cards. In some embodiments, a user inserts one type of card into one socket and another type of card into another socket. Control board 300 may be configured to determine which type of card is inserted into socket 116. In some embodiments, control board 300 varies the amount of power that goes to the card within socket 116 based on the type of card. Control board 300 may be coupled to cooling system 200 and power supply system 301.

Referring to FIGS. 1 and 2, housing 102 may include cutouts or openings 110. Cutouts 110 may be disposed on front panel 108 of housing 102. Although FIGS. 1-4 show housing 102 having four cutouts 110, housing 102 may have one cutout, two cutouts, three cutouts, five cutouts, six cutouts, seven cutouts, or eight cutouts. The number of cutouts 110 may correspond with the number of sockets 116 of control board 300. Cutouts 110 may be configured to receive network interface card 103 allowing network interface card 103 to be secured to sockets 116. Network interface card 103 may be coupled to a network via an Ethernet cord or a coupling mechanism, such as sockets 116, configured to allow network interface card 103 to be coupled to a network. In practice, a user may insert network interface card 103 through cutout 110 such that it can be received by and coupled to socket 116 of control board 300. Cutouts 110 may be located along front panel 108 to correspond with the one or more sockets 116. In some embodiments, cutout 110 is parallel to socket 116. However, cutout 110 may be perpendicular to socket 116. Cutout 110 may be aligned with socket 116 such that when network interface card 103 is inserted into cutout 110, a portion of network interface card 103 engages with socket 116.

Figure 8:
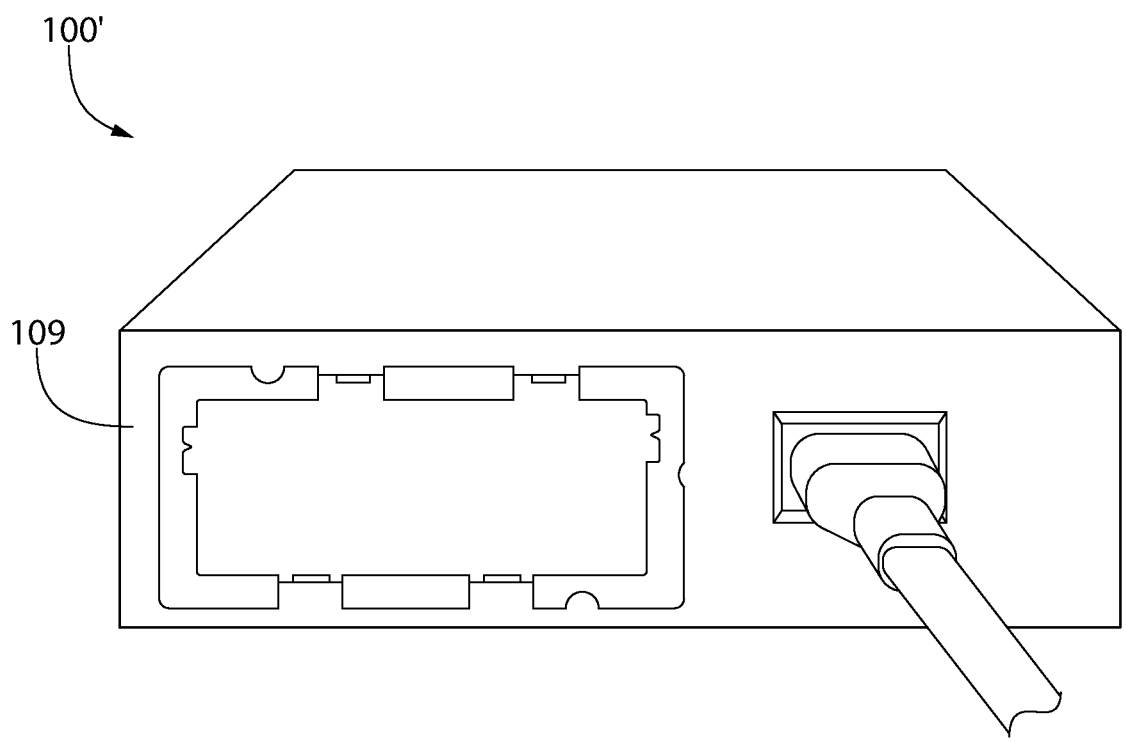
FIG. 8 is a rear perspective view of a system in accordance with an exemplary embodiment of the present invention.
Figure 9A:
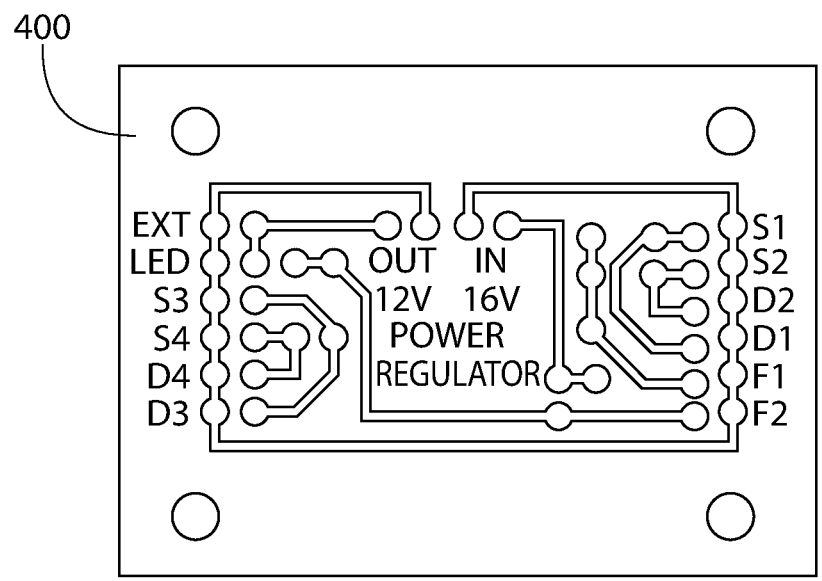
FIGS. 9A and 9B are top views of a control board in accordance with an exemplary embodiment of the present invention.
Figure 9B:
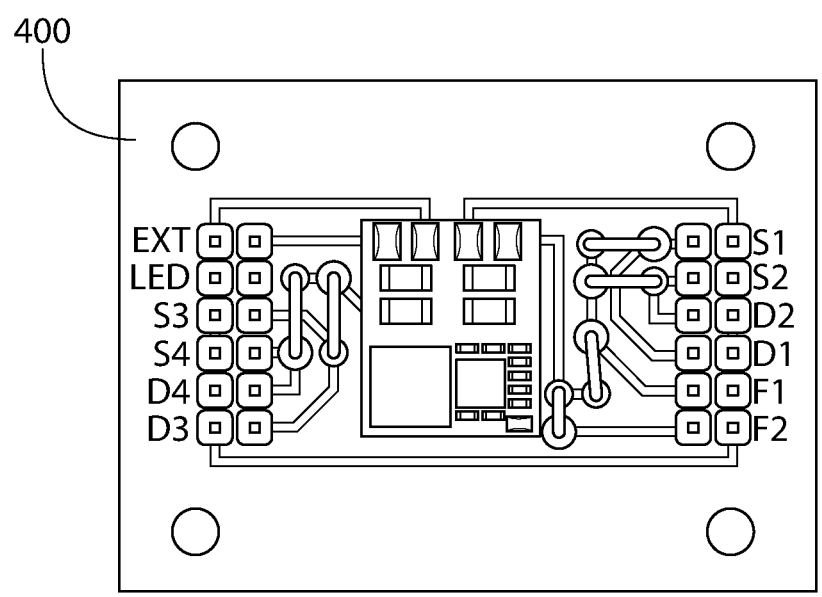
Figure 10A:
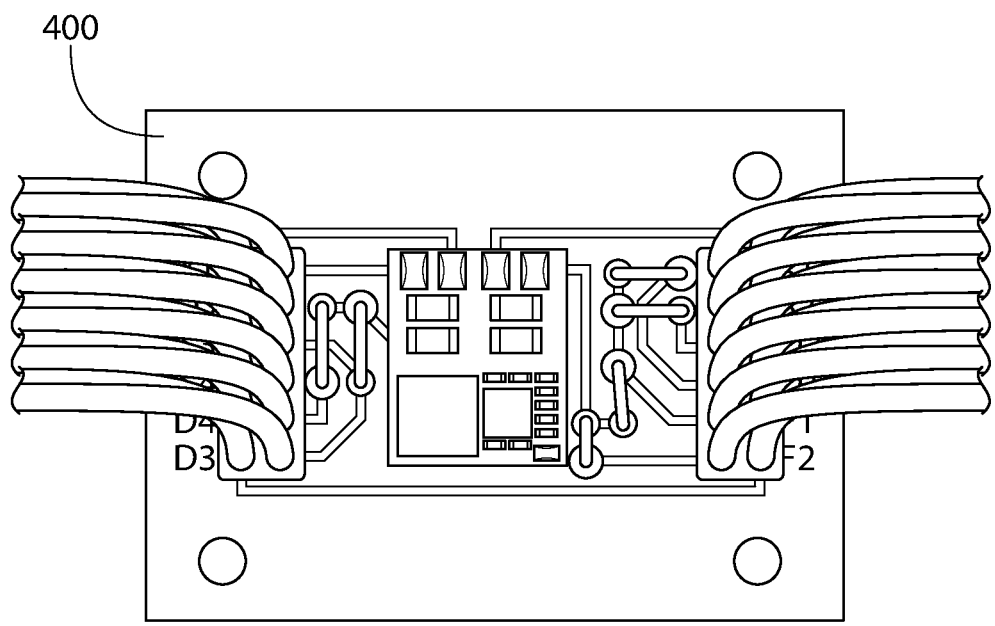
FIG. 10A is a top view of the control board of FIG. 9B.
Figure 10B:
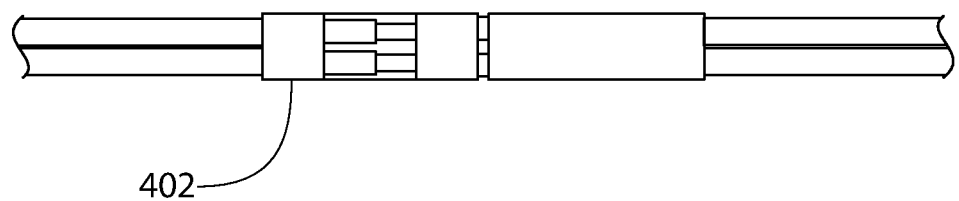
FIG. 10B is an illustration of a connector used with the control board of FIG. 9B.
Figure 11:
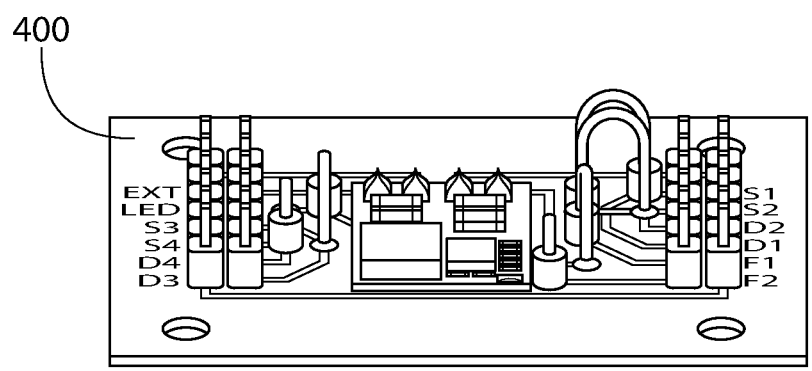
FIG. 11 is a top perspective view of the control board of FIG. 9B.

Referring to FIG. 8, system 100' may be similar to system 100, but may include a single cutout 110 and a single socket 116 for receiving a single network interface card. For example, system 100' may be configured to only configure a single network interface card and thus may only include a single socket 116. In this configuration, housing 102 of system 100' may be reduced in size compared to having a plurality of sockets 116. For example, housing 102 of system 100' may have a length of approximately 5.5 inches, a width of approximately 6 inches, and a height of approximately 1.75 inches. In some embodiments, system 100' having only a single socket 116 results in a lighter housing 102 compared to system 100 having a plurality of sockets 116. For example, housing 102 of system 100' having a single socket 116 results in housing 102 having a weight of approximately 1.25 lbs. In some embodiments, a user configures network interface card 103 within system 100' having a single socket 116 and then transfers network interface card 103 to system 100 having a plurality of sockets 116 to test network interface card 103 with a plurality of other network interface cards 103.

In some embodiments, network interface card 103 includes engagement portion or feature 105. Engagement portion 105 may be configured to be inserted into socket 116 of control board 300. For example, control board 300 may include socket 116, which may be configured to removably received and secure engagement portion 105 of network interface card 103. In some embodiments, socket 116 aligns with cutout 110 such that when network interface card 103 is inserted into cutout 110, engagement portion 105 aligns with socket 116. Socket 116 may be configured to secure, couple, and engage with engagement portion 105. Once engagement portion 105 is inserted into socket 116, control board 300 may be provide power to network interface card 103. In some embodiments, once control board 300 is providing power to network interface card 103, indicator 115 may illuminate to indicate that network interface card 103 is receiving power. In some embodiments, each socket 116 may include an indicator. Indicator 115 may be an LED.

Referring to FIG. 3, system 100 may include rib 117. Rib 117 may be disposed within housing 102 between front panel 108 and back panel 109. In some embodiment, rib 117 includes support 119, which is configured and dimensioned to engage network interface card 103. Support 119 may engage network interface card 103 when network interface card 103 is inserted through cutout 110 of housing 102. In some embodiments, support 119 engages with network interface card 103 when network interface card 103 is in an aligned configuration with socket 116. Rib 117 and support 119 may be disposed within housing 102 and may be configured to guide network interface card 103 into housing 102 and assist network interface card 103 in coupling to socket 116.

In some embodiments, system 100 may include light indicators (e.g., indicator 115) disposed proximate to each cutout 110. Light indicator may illuminate to indicate that a network interface card has been properly and securely inserted into socket 116. The light indicators may illuminate to indicate that power from power supply system 301 is being applied to the network interface card. System 100 may include other indicators proximate to each cutout 110 to indicate power levels, errors, network issues, or any other indication. In some embodiments, system 100 includes a plurality of light indicators. For example, system 100 may include one light indicator for power status, one light indicator for network status, one light indicator for an error, and/or one light indicator for operation of cooling system 200.

Figure 4A:
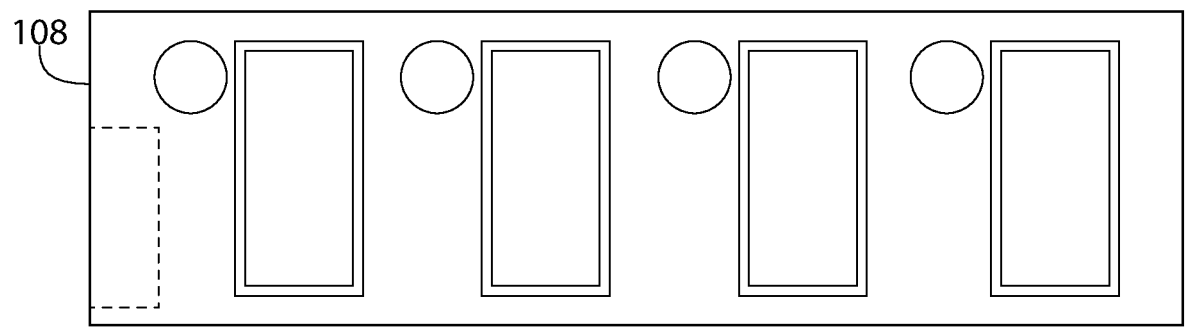
FIG. 4A is a schematic diagram of a front panel of the system of FIG. 1 in accordance with an exemplary embodiment of the present invention.
Figure 4B:
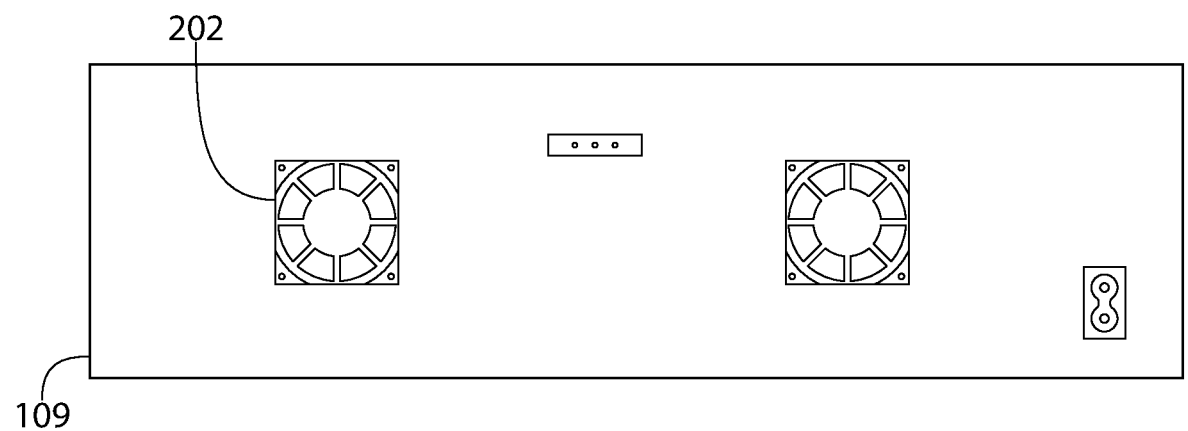
FIG. 4B is a schematic diagram of a back panel of the system of FIG. 1 in accordance with an exemplary embodiment of the present invention.
Figure 7:
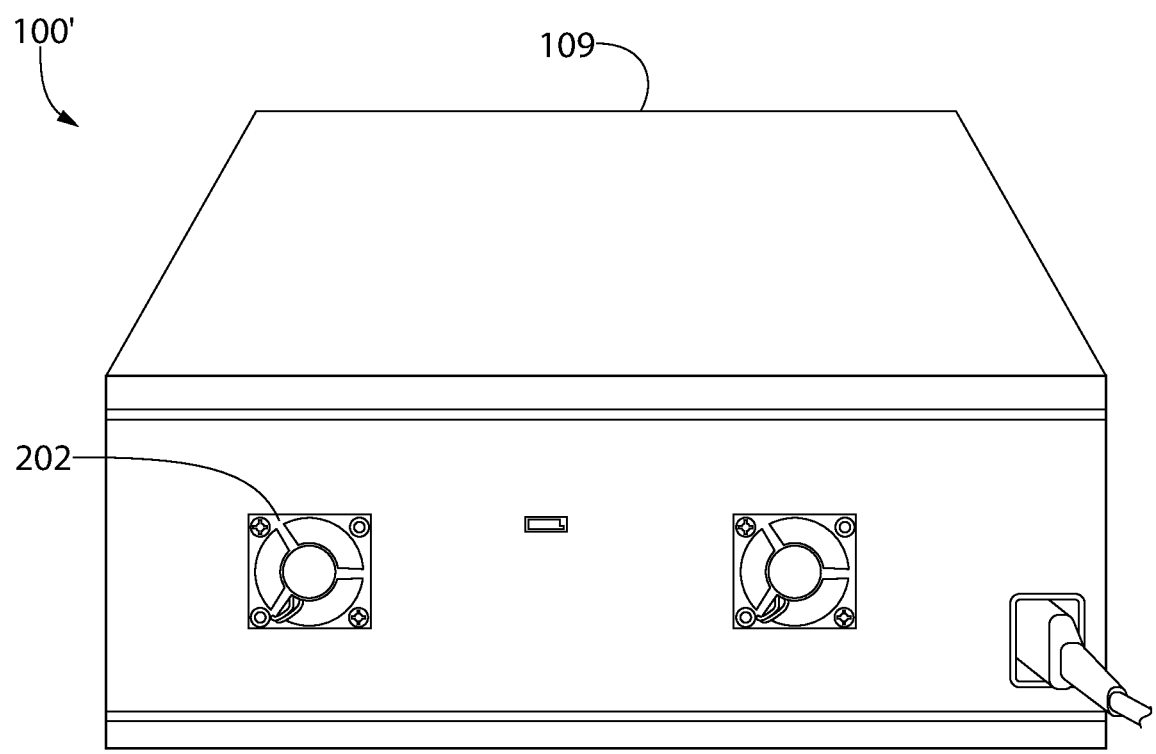
FIG. 7 is a rear perspective view of a system in accordance with an exemplary embodiment of the present invention.

Referring to FIGS. 2, 4 and 7, system 100 may include cooling system 200. Cooling system 200 may be configured to regulate the temperature of control board 300 and network interface card 103 coupled to control board 300. In some embodiments, system 100 may include one or more cooling fans 202. Cooling fan 202 may be a 30 mm cooling fan. However, cooling fans 202 may be sized and shaped to be disposed within housing 102. Cooling fan 202 may be a 24 volt fan providing 2.25 cubic feet per minute (CFM) of air flow. However, cooling fan 202 may provide 1 to 5 CFM of air flow throughout housing 102.

Cooling system 200 may include internal cooling chambers configured to assist cooling fans 202 in regulating the temperature of control board 300 and network interface card 103. The internal cooling chambers may have a depth of 6 inches, a width of 4.5 inches, and height of 3.5 inches. However, the internal cooling chambers may have a depth of 3 inches to 9 inches, a width of 2 inches to 8 inches, and a height of 2 inches to 9 inches. Cooling system 200 may be configured to manage the air flow inside housing 102 and assist in extracting heat disposed within housing 102. For example, fans 202 of cooling system 200 may allow circulate air within system 100 and may vent air out of system 100. In some embodiments, cooling system 200 includes air pathways to allow air to flow over specific areas and components of housing 102 to assist in transferring heat to the air for venting out of system 100. Cooling system 200 may circulate air throughout housing 102 to ensure that heat is transferred from various components (e.g., network interface card, network card, power supply) to the air and then vented out through one or more vents disposed on housing 102.

In some embodiments, system 100 includes cooling fans 202 that can be powered independently. For example, system 100 may include two cooling fans 202; one cooling fan 202 disposed on a left side of housing 102 and the other cooling fan 202 may be disposed on a right side of housing 102. The cooling fans 202 may control the air flow around specific sockets 116. Each side's cooling fans 202 controls air flow and cooling independently. In some embodiments, the number of cooling fans 202 and the location of cooling fans 202 may correspond to the number of sockets 116. In some embodiments, system 100 may include one or more cooling zones each associated with a one or more cooling fans 202. For example, control board 300 may have four sockets 116 and cooling system 200 may have four cooling fans 202 each associated with each socket 116. Byway of another example, control board 300 may have four sockets 116 and cooling system 200 may have two cooling fans 202, each cooling fan 202 associated with two socket 116. If only one or two network interface cards 103 are being used, then only one cooling fan 202 needs to be powered. This provides system 100 with power consumption efficiencies.

In some embodiments, housing 102 may include one or more ventilation holes to allow for passive cooling of system 100, network interface card 103, and other components disposed within housing 102. For example, housing 102 may include one or more ventilation holes disposed on bottom surface 112 and/or top surface 104. The ventilation holes may assist in air circulation allowing for temperature regulation of the interior of housing 102. In some embodiments, system 100 may include a layer of plexiglass or similar material to assist in the dissipation of heat generated by network interface card 103 and control board 300. For example, the layer of plexiglass may be disposed proximate to top surface 104 or bottom surface 112. In some embodiments, housing 102 includes fan openings sized and shaped to receive cooling fans 202. The fan openings of housing 102 may be disposed on back panel 109 and allow for air to be circulated out of housing 102 via cooling fans 202.

Figure 5:
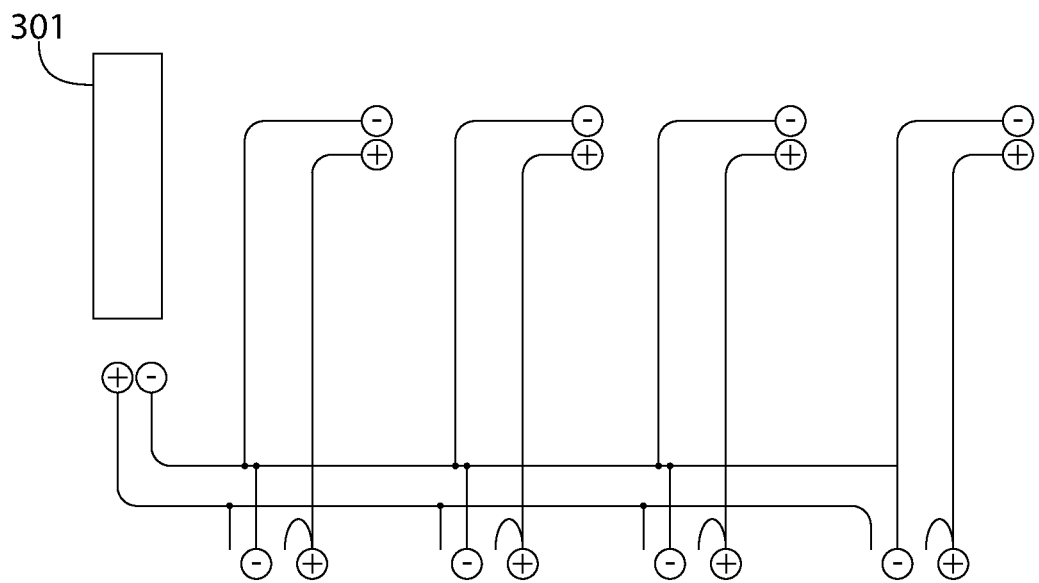
FIG. 5 is a wiring schematic diagram of the system of FIG. 1 in accordance with an exemplary embodiment of the present invention.

Referring to FIGS. 3 and 5-6, housing 102 may include power supply system 301. In some embodiments, control board 300 includes power supply system 301. In some embodiments, power supply system 301 is coupled to control board 300 to provide power to cooling system 200 and network interface card 103 coupled to control board 300. In some embodiments, power supply system 301 may provide 12 Volts DC to control board 300 to allow for ample power without resulting in overheating of control board 300 and/or network interface card 103. In some embodiments, system 100 requires a power supply of between approximately 12 to approximately 36 volts DC power. In some embodiments, certain network interface card 103 require a lower amount of power requiring the use of a voltage or power regulator configured to step down the power from the power source. For example, system 100 may include network interface card 103 having a power requirement of between 5-12 Volts DC. System 100 may include a power regulator to step down the power from provided 16 volts DC to 12 volts DC.

In some embodiments, power supply system 301 may be configured to provide different power parameters to the different components and network interface card 103 through the use of voltage and/or power regulators. In some embodiments, power supply system 301 may include one or more diodes that are configured to mitigate power bleed and unintended power state of cooling fan 202. For example, the one or more diodes may assist in controlling the flow of power from power supply to the necessary components. In some embodiments, system 100 may include expansion socket 303 configured to be used with network interface card 103 requiring different parameters than network interface card 103 coupled to sockets 116. For example, expansion socket 303 may be configured to be used with a network interface card that requires 5-12 volts DC, whereas sockets 116 may be used with network interface card 103 requiring 12-36 volts DC.

In some embodiments, power supply system 301 provides power to network interface card 103 via sockets 116 of control board 300. A separate network cable may be connected to each card to connect network interface card 103 to a network and/or computer. This allows the user the ability to configure network interface card 103 using the computer and see and configure/deploy configuration to the necessary servers by either direct connection and/or network access. In some embodiments, system 100 may include a network switch to allow network multi-port capability and reduce network ports dependency.

Referring to FIG. 6, an electrical diagram of system 100 is shown. In some embodiments, power supply system 301 includes one or more switches 302. Switches 302 may be disposed to each socket 116 to control/manage specific power. In some embodiments, switches 302 are configured to simulate power outage, hard reset or an unused socket shut off. Additionally, switches 302 may control cooling fans 202. Switches 302 may be configured to control power to one or more sockets 116 for providing power to network interface card 103.

Referring to FIGS. 9A-11, system 100 may include processor 400. Processor 400 may be coupled to control board 300. In some embodiments, processor 400 is coupled to control board 300 and provides communication to control board 300. For example, processor 400 may receive instructions form a user and may transmit the instructions to control board 300. Processor 400 may include connector 402, which may assist in coupling processor 400 to other components of system 100. Processor 400 may be a printed circuit board (PCB).

Figure 12:
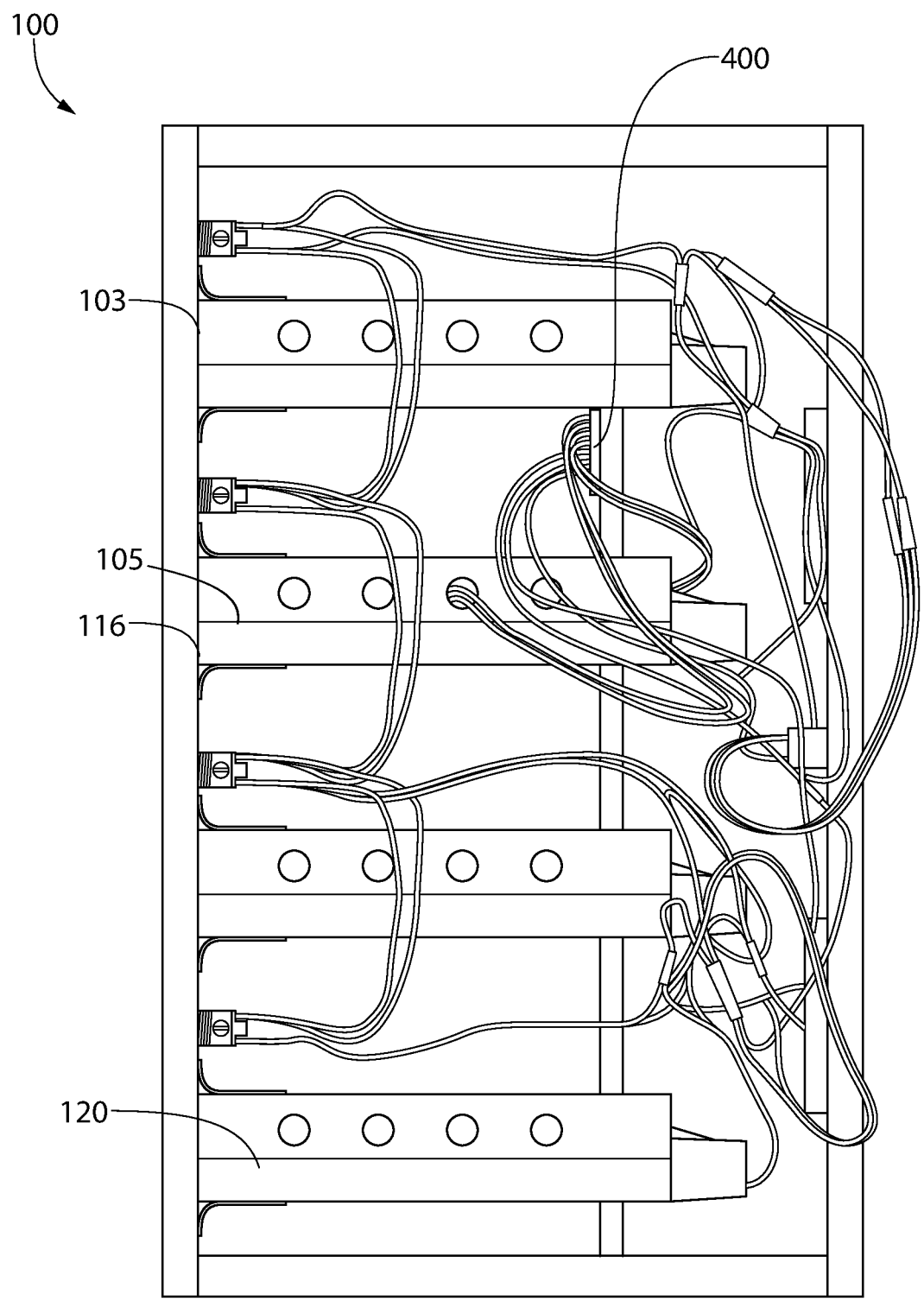
FIG. 12 is a top perspective view of a system with mounts in accordance with an exemplary embodiment of the present invention.

Referring to FIG. 12, system 100 may include a plurality of sockets 116, each configured to secure mount 120. Mount 120 may be configured to receive and secure network interface card 103 and socket 116 may allow for easy access and control of network interface card 103 disposed within mount 120. System 100 may also include processor 400. Processor 400 may be coupled to one or more mounts 120 to control the power supplied to each network interface card 103 disposed in mounts 120.

In some embodiments, system 100 is configured to allow for the testing of certain configurations and updates to network interface card 103 prior to updating a server. For example, system 100 includes a testing platform through which a user can develop new standards and/or validate the stability of code deployment configuration settings and firmware before being placed into production. System 100 segregates production and risk associated in a controlled development & testing environment. System 100 allows for a mass deployment test and verification as well as, test run to different network interface card versions outside production.

In some embodiments, system 100 is used to configure a server. For example, a user may place network interface card 103 into cutout 110 of housing 102 of system 100. In some embodiments, the user secures network interface card 103 into socket 116 disposed on control board 300. Socket 116 may be configured to secure and lock network interface card 103 in place and to control board 300. Network interface card 103 may be coupled to control board 300 such that power is transmitted to network interface card 103 from control board 300. In some embodiments, an electronic device is coupled to network interface card 103 to configure network interface card 103 using the electronic device. The electronic device may be a computer, laptop, mobile device, tablet, or any other type of electronic device. Network interface card 103, once configured, may be removed from system 100. A user may then remove an outdated network interface card from the UPS and replace the outdated network interface card with the configured network interface card.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A system for configuring a server comprising:
    a portable housing having a front panel, a back panel opposite the front panel, and a cutout disposed on the front panel;
    a control board disposed within the portable housing, the control board having a socket configured to operably receive and couple to a network interface card that is insertable into and removable from the housing only through the cutout, wherein the socket aligns with a feature of the network interface card that engages the socket to power the network interface card and the control board is configured to communicate with the network interface card;
    a rib disposed within the portable housing between the front panel and the back panel, the rib having a support configured and dimensioned to engage the network interface card when the network interface card is inserted within the housing in an aligned configuration with the socket;
    a cooling system coupled to and powered via the control board, the cooling system including one or more fans disposed at least partially disposed within the portable housing; and
    a power supply system coupled to the control board, the power supply system configured to provide power to the control board, the network interface card, and the one or more fans.

2. The system of claim 1, wherein the one or more fans are disposed on the back panel.

3. The system of claim 1, wherein the portable housing has a length 11 inches or less and a width 6.75 inches or less.

4. The system of claim 1 further comprising:
    one or more ventilation holes disposed on the portable housing.

5. The system of claim 4, wherein the one or more ventilation holes are disposed on atop surface and/or a bottom surface of the portable housing.

6. The system of claim 1 wherein the cutout is sized and dimensioned to permit at least a portion of the network interface card to engage the front panel when the network interface card is inserted within the cutout of the housing in operable engagement with the control board and supported by the rib.

7. The system of claim 1 further comprising:
    a plurality of sockets and a plurality of cutouts configured to simultaneously operably receive a plurality of network interface cards that when inserted into the plurality of cutouts are in parallel alignment.

8. The system of claim 1 further comprising:
    a mount disposed within the housing and substantially perpendicular to the rib, the mount configured to abut the network interface card when the network interface card is inserted through the cutout.

9. The system of claim 1 further comprising:
    one or more switches coupled to the control board.

10. The system of claim 1 further comprising:
    a power regulator configured to step down power supplied from the power supply system.

11. A method for configuring a server comprising:
    placing a network interface card into an cutout of a portable server configuration system, the portable server configuration system including a housing and a control board disposed within the housing;
    securing the network interface card into a socket disposed on the control board, the socket configured to secure and lock the network interface card in place;
    coupling the network interface card to the control board such that power is transmitted to the network interface card from the control board;
    coupling an electronic device to the network interface card to configure the network interface card;
    removing the configured network interface card from the portable server configuration system; and
    placing the configured network interface card in a power supply unit such that the power supply unit is coupled to the network interface card, wherein the power supply unit is located remote to the portable server configuration system.

12. The method of claim 11, wherein the electronic device is one of a computer, a laptop, or a mobile device.

13. The method of claim 11 further comprising:
    removing an outdated network interface card from a power supply.

14. The method of claim 11, wherein the power supply unit is an uninterruptible power supply.

* * * * *